US00RE38381E

(19) United States
(12) Reissued Patent
Martich

(10) Patent Number: US RE38,381 E
(45) Date of Reissued Patent: Jan. 13, 2004

(54) INVERTED BOARD MOUNTED ELECTROMECHANICAL DEVICE

(75) Inventor: Mark E. Martich, Barrington, RI (US)

(73) Assignee: Kearney-National Inc., White Plains, NY (US)

(21) Appl. No.: 10/023,176

(22) Filed: Apr. 23, 2002

Related U.S. Patent Documents

Reissue of:
(64) Patent No.: 6,294,971
Issued: Sep. 25, 2001
Appl. No.: 09/833,867
Filed: Apr. 12, 2001

U.S. Applications:
(60) Provisional application No. 60/219,817, filed on Jul. 21, 2000.

(51) Int. Cl.[7] ..... H01H 1/66; H01H 51/00
(52) U.S. Cl. ..... 335/151
(58) Field of Search ..... 335/151–154, 335/205–208

(56) References Cited

U.S. PATENT DOCUMENTS

| | | | |
|---|---|---|---|
| 2,945,163 | A | 7/1960 | Kilby et al. |
| 3,408,602 | A | 10/1968 | McWhorter |
| 3,480,836 | A | 11/1969 | Aronstein |
| 3,517,273 | A | 6/1970 | Bentley et al. |
| 3,575,678 | A | 4/1971 | Barton |
| 3,939,381 | A | 2/1976 | Meany |
| 4,389,627 | A | 6/1983 | Uesugi et al. |
| 4,947,235 | A | 8/1990 | Roth et al. |
| 4,975,761 | A | 12/1990 | Chu |
| 5,043,534 | A | 8/1991 | Mahulikar et al. |
| 5,175,613 | A | 12/1992 | Barker, III et al. |
| 5,239,198 | A | 8/1993 | Lin et al. |
| 5,294,826 | A | 3/1994 | Marcantonio et al. |
| 5,355,016 | A | 10/1994 | Swirbel et al. |
| 5,400,949 | A | 3/1995 | Hirvonen et al. |
| 5,403,782 | A | 4/1995 | Dixon et al. |
| 5,418,688 | A | 5/1995 | Hertz et al. |
| 5,422,433 | A | 6/1995 | Rivera et al. |

(List continued on next page.)

FOREIGN PATENT DOCUMENTS

| | | | |
|---|---|---|---|
| EP | 0 805 471 | A1 | 4/1996 |

*Primary Examiner*—Ramon M. Barrera
(74) *Attorney, Agent, or Firm*—Barlow, Josephs & Holmes, Ltd.

(57) ABSTRACT

A new board mounted electromechanical device is provided that mounts to a relay substrate to form a low profile reed relay. The reed relay is electrically connected to the electrical contacts via a signal traces and additional electrical traces located on the same side of the relay substrate which connect to the relay's signal and shielding. Additional traces on both sides of the signal traces of the reed relay provide a co-planar wave guide to maintain the desired impedance of the signal path. The reed relay is mounted in an inverted manner into a cut-out in the main circuit board so that the other portion of the reed relay itself is sits within the cut-out in the main circuit board. As a result, the reed relay component is recessed below the surface of the main circuit board resulting in an overall low profile circuit board.

10 Claims, 6 Drawing Sheets

U.S. PATENT DOCUMENTS 5,436,203 A 7/1995 Lin
5,438,307 A 8/1995 Chou
5,459,287 A 10/1995 Swamy
5,483,423 A 1/1996 Lewis et al.
5,485,037 A 1/1996 Marrs
5,486,720 A 1/1996 Kierse
5,525,834 A 6/1996 Fischer et al.
5,530,202 A 6/1996 Dais et al.
5,535,101 A 7/1996 Miles et al.
5,541,450 A 7/1996 Jones et al.
5,543,663 A 8/1996 Takubo
5,557,142 A 9/1996 Gilmore et al.
5,559,306 A 9/1996 Mahulikar
5,561,265 A 10/1996 Livshits et al.
5,566,055 A 10/1996 Salvi, Jr.
5,574,314 A 11/1996 Okada et al.
5,583,378 A 12/1996 Marrs et al.
5,629,835 A 5/1997 Mahulikar et al.
5,633,786 A 5/1997 Matuszewski et al.
5,640,048 A 6/1997 Selna
5,650,659 A 7/1997 Mostafazadeh et al.
5,666,272 A 9/1997 Moore et al.
5,668,406 A 9/1997 Egawa
5,684,441 A 11/1997 Graeber et al.
5,694,300 A 12/1997 Mattei et al.
5,701,032 A 12/1997 Fischer et al.
5,708,567 A 1/1998 Shim et al.
5,777,382 A 7/1998 Abbott et al.
5,789,068 A 8/1998 King et al.
5,789,815 A 8/1998 Tessier et al.
5,796,170 A 8/1998 Marcantonio
5,798,567 A 8/1998 Kelly et al.
5,819,398 A 10/1998 Wakefield
5,831,832 A 11/1998 Gillette et al.
5,838,551 A 11/1998 Chan
5,854,512 A 12/1998 Manteghi
5,943,216 A 8/1999 Schmidt
6,025,768 A 2/2000 Martich
6,052,045 A 4/2000 Martich

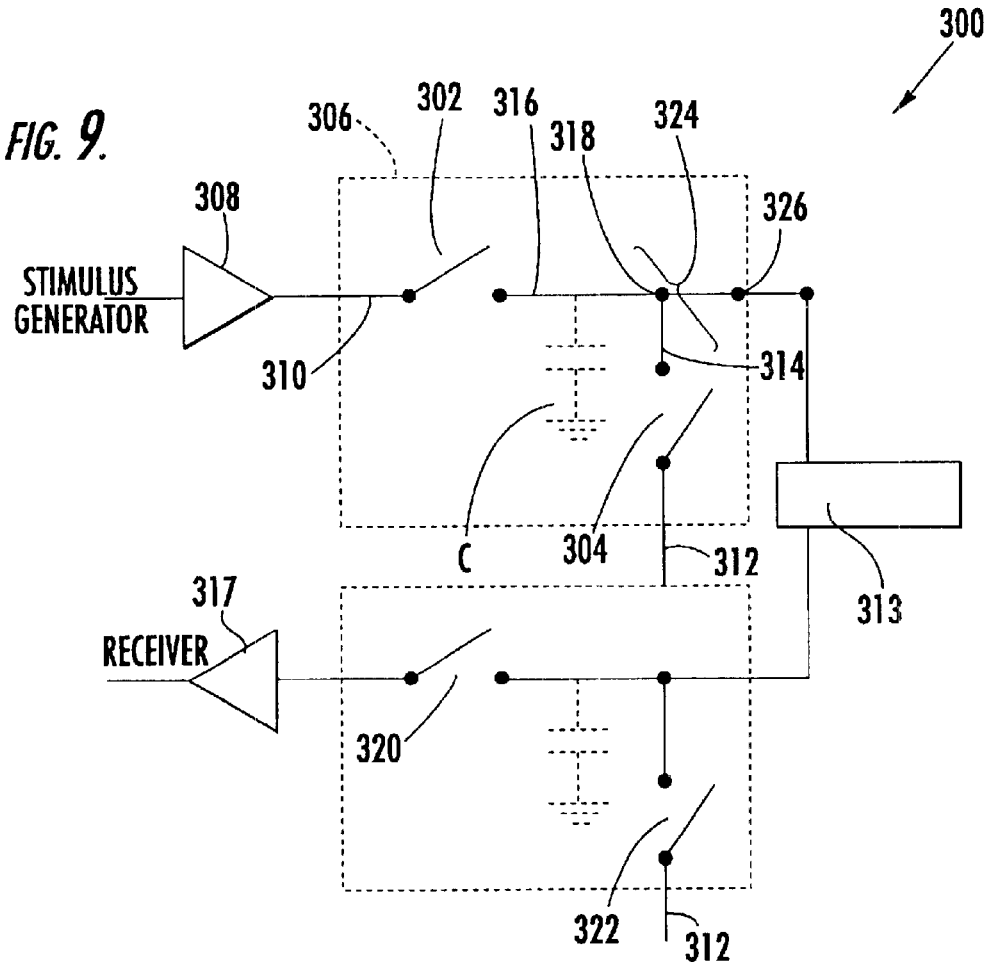
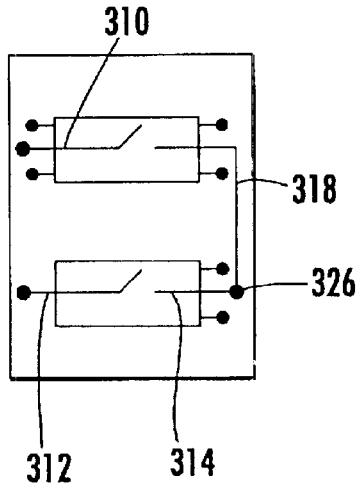
FIG. 10.

INVERTED BOARD MOUNTED ELECTROMECHANICAL DEVICE

Matter enclosed in heavy brackets [ ] appears in the original patent but forms no part of this reissue specification; matter printed in italics indicates the additions made by reissue.

BACKGROUND OF THE INVENTION

This application claims priority from Provisional Patent Application Ser. No. 60/219,817, filed Jul. 21, 2000.

The present invention relates generally to switching devices. More specifically, the present invention relates to improved packaging and circuit integration for electromagnetic devices, such as reed switches and electromagnetic devices such as reed relays.

Electromagnetic relays have been known in the electronics industry for many years. Such electromagnetic relays include the reed relay which incorporates a reed switch. A reed switch is a magnetically activated device that typically includes two flat contact tongues which are merged in a hermetically sealed glass tube filled with a protective inert gas or vacuum. The switch is operated by an externally generated magnetic field, either from a coil or a permanent magnet. When the external magnetic field is enabled, the overlapping contact tongue ends attract each other and ultimately come into contact to close the switch. When the magnetic field is removed, the contact tongues demagnetize and spring back to return to their rest positions, thus opening the switch.

Reed switches, actuated by a magnetic coil, are typically housed within a bobbin or spool-like member. A coil of wire is wrapped about the outside of the bobbin and connected to a source of electric current. The current flowing through the coil creates the desired magnetic field to actuate the reed switch within the bobbin housing. Some applications of reed devices require the switch to carry signals with frequencies in excess of 500 MHz. For these applications, a ground shield conductor, commonly made of copper or brass is disposed about the body of the reed switch. The ground shield conductor is commonly in a cylindrical configuration. The shield conductor resides between the reed switch and the bobbin housing to form a co-axial high frequency transmission system. This co-axial system includes the outer shield conductor and the switch lead signal conductor co-axially through the center of the reed switch. The ground shield conductor is employed to contain the signal through the switch conductor in order to maintain the desired impedance of the signal path.

Currently available reed devices are then incorporated into a given circuit environment by users. For application at higher frequencies, a reed switch device must be ideally configured to match as closely as possible the desired impedance requirements of the circuit in which it is installed.

Within a circuit environment, a co-axial arrangement is preferred throughout the entire environment to maintain circuit integrity and the desired matched impedance. As stated above, the body of a reed switch includes the necessary co-axial environment. In addition, the signal trace on the user's circuit board commonly includes a "wave guide" where two ground leads reside on opposing sides of the signal lead and in the same plane or a "strip line" where a ground plane resides below the plane of the signal conductor. These techniques properly employed provide a two-dimensional, co-axial-like environment which is acceptable for maintaining the desired impedance for proper circuit function.

However, the reed switch device must be physically packaged and electrically interconnected to a circuit board carrying a given circuit configuration. It is common to terminate the shield and signal terminals to a lead frame architecture and enclose the entire assembly in a dielectric material like plastic for manufacturing and packaging ease. These leads may be formed in a gull-wing or "J" shape for surface mount capability. The signal leads or terminals exit out of the reed switch body and into the air in order to make the electrical interconnection to the circuit board. This transition of the signal leads from plastic dielectric to air creates an undesirable discontinuity of the protective co-axial environment found within the body of the switch itself. Such discontinuity creates inaccuracy and uncertainty in the impedance of the reed switch device. As a result, circuit designers must compensate for this problem by specifically designing their circuits to accommodate and anticipate the inherent problems associated with the discontinuity of the protective co-axial environment and the degradation of the rated impedance of the reed switch device. For example, the circuit may be tuned to compensate for the discontinuity by adding parasitic inductance and capacitance. This method of discontinuity compensation is not preferred because it complicates and slows the design process and can degrade the integrity of the circuit. There is a demand to reduce the need to tune the circuit as described above. The prior art uses a structure of carefully designed vias, which are expensive and difficult to manufacture, to control the impedance from the relay to the board transition.

In view of the foregoing, there is a demand for a reed switch device that includes a controlled impedance environment through the entire body of the package to the interconnection to a circuit. There is a particular demand for a reed switch device to be compact and of a low profile for installation into small spaces and for circuit board stacking. There is further a demand for reed switch devices that are of a surface mount configuration to optimize the high frequency of the performance of the system. Further, there is a demand for a reed switch device that can reduce the need to tune a circuit to compensate for an uncontrolled impedance environment. Also, there is a demand for a reed switch device that has a small footprint and is of a standard shape and configuration for simplified manufacture and installation.

SUMMARY OF THE INVENTION

The present invention preserves the advantages of prior art electromagnetic switch devices, such as reed relays. In addition, it provides new advantages not found in currently available switching devices and overcomes many disadvantages of such currently available devices.

The invention is generally directed to the novel and unique reed switch device with particular application in effectively interconnecting a reed switch device to a circuit on a circuit board in a low profile configuration. The reed switch package of the present invention enables the efficient and effective interconnection to a circuit board while being in an inexpensive construction.

A new electromechanical device is provided that mounts to a relay substrate to form a low profile, board mountable reed relay. A portion of the reed relay extends through an aperture in the relay substrate. The substrate includes a series of electrical contacts, such as solder balls array (BGA), land grid array (LGA), column grid array (CGA), or pin grid array (PGA), mounted to the same side of the substrate that the relay mounts to electrically connect to the main circuit card. The reed relay itself is directly electrically connected to the electrical contacts via signal traces and additional electrical traces located on the bottom of the relay substrate which connect to the relay's shielding. These additional traces are routed in a parallel position on both sides of the signal traces to provide a co-planar wave guide to maintain the desired impedance of the signal path. The reed relay substrate is mounted into a cut-out in the main circuit board in an inverted manner so that a portion of the reed relay not within the substrate recess sits within a cut-out in the main circuit board. As a result, the reed relay component is recessed below the surface of the main circuit board resulting in an overall low profile circuit board.

It is therefore an object of the present invention to provide a compact, low profile reed switch package.

It is an object of the present invention to provide a reed switch device with a controlled impedance environment throughout the entire package.

It is a further object of the present invention to provide a reed switch package that is easily matched to the impedance of an existing circuit environment.

Another object of the present invention is to provide a reed switch package that is capable of efficiently conducting high frequency signals.

It is a further object of the present invention to provide a reed switch package that is inexpensive to manufacture by not requiring the use of plated through hole vias.

It is yet a further object of the present invention to provide a reed switch package with a small footprint.

Another object of the present invention is to provide a reed switch package that can be easily surface mounted to a main circuit board.

BRIEF DESCRIPTION OF THE DRAWINGS

The novel features which are characteristic of the present invention are set forth in the appended claims. However, the invention's preferred embodiments, together with further objects and attendant advantages, will be best understood by reference to the following detailed description taken in connection with the accompanying drawings in which:

FIG. 9 is a schematic representation of a circuit commonly used with reed relays; and FIG. 10 is pictorial implementation of the circuit shown in FIG. 9.

DETAILED DESCRIPTION OF THE PREFERRED EMBODIMENT

Figure 1:
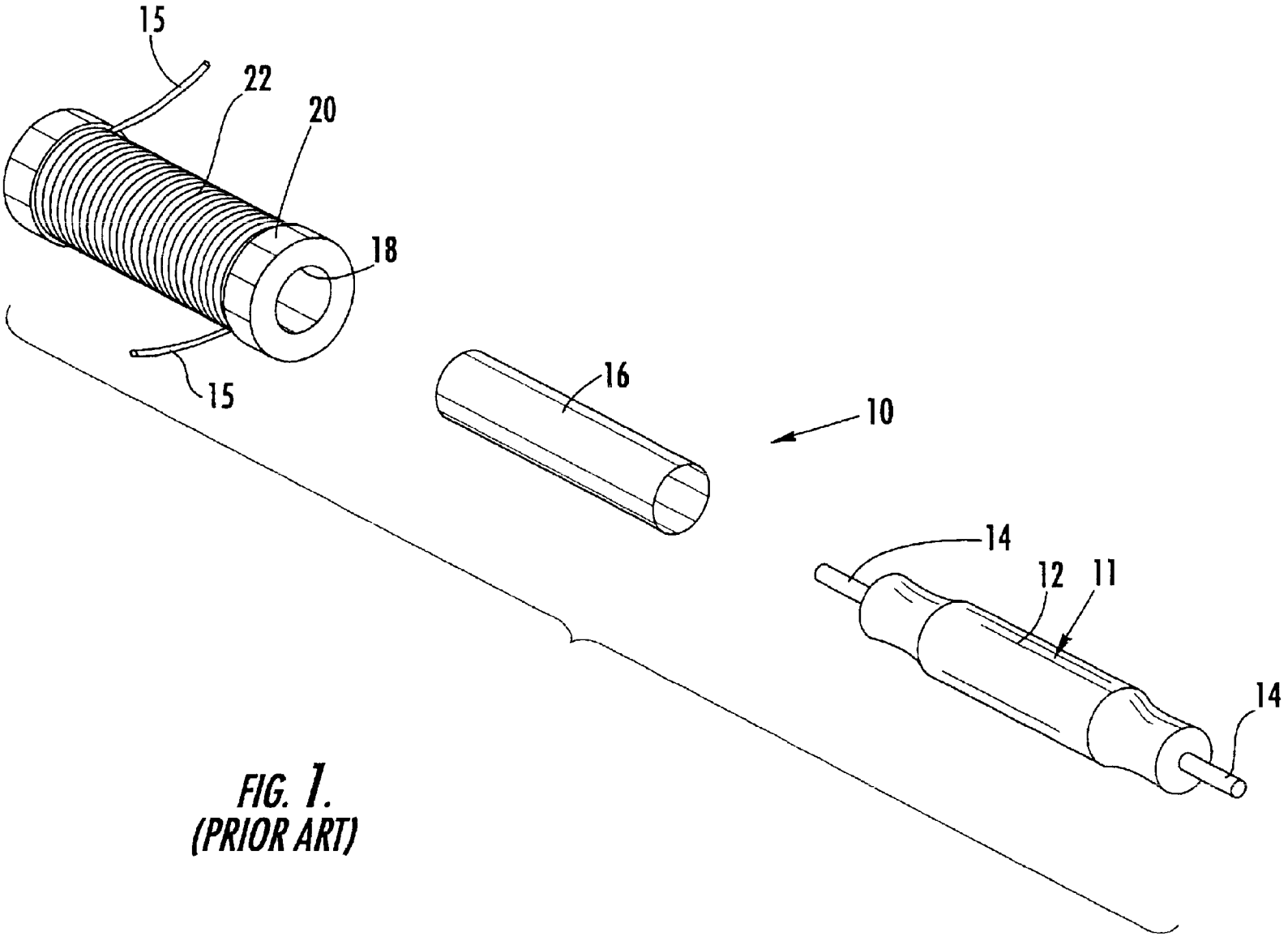
FIG. 1. (PRIOR ART)
FIG. 1 is a perspective view of a prior art reed relay configuration.

Turning first to FIG. 1, a perspective view of a prior art reed switch configuration 10 is shown. A known reed switch 11 includes a glass envelope 12 as well as two signal leads 14 emanating from opposing ends of the reed switch 11 and coil termination leads 15. The construction of a reed switch 11 is so well known in the art, the details thereof need not be discussed. A shield conductor 16, commonly made of brass or copper, is provided in the form of a cylindrical sleeve which receives and houses the reed switch 11. The reed switch 11 and shield 16 are housed within the central bore 18 of a bobbin or spool 20. About the bobbin 20 is wound a conductive wire 22. As a result, a co-axial arrangement is formed to protect the reed switch 11 device and to control the impedance of the environment and to improve the overall transmission of the signal. The reed switch 11, shield conductor 16 and bobbin 20 are shown in general as cylindrical in configuration. It should be understood that various other configurations, such as those oval in cross-section, may be employed and still be within the scope of the present invention.

As can be understood and known in the prior art, the free ends of the coil of wire 22, the shield 16 and signal terminals 14 of the reed switch 11 are electrically interconnected to a circuit as desired. The respective components of the reed switch 11 configuration are interconnected to a circuit by lead frame or other electrical interconnection (not shown). The lead frame or other electrical interconnection introduces a discontinuity of the desirable co-axial environment.

As described above, the overall reed switch device 10 must be designed to be easily accommodated within a user's circuit. For example, a circuit used to operate at high frequency is designed with a defined characteristic impedance environment. The goal of designing and manufacturing a reed device 10 to the specifications of a circuit customer is to match the desired impedance of the device 10 to the circuit environment as closely as possible. It is preferred that there is no discontinuity of impedance from the reed device 10 itself to a circuit board trace of the circuit that will receive the device 10. The characteristic impedance, $Z_1$, is generally a function of the outer diameter of the signal conductor 14, the inner diameter of the shield 16 and the dielectric constant of the insulation (not shown) between the signal conductor 14 and the shield 16.

Figure 2:
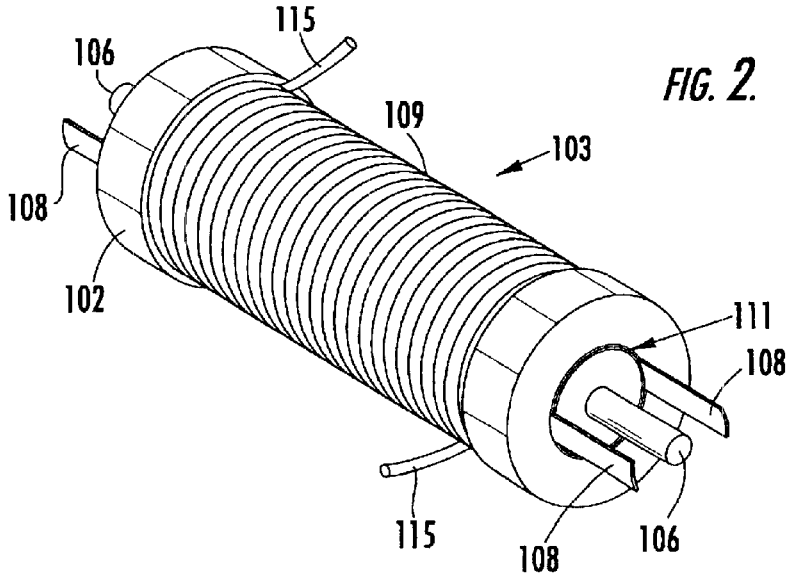
FIG. 2 is an perspective view a reed relay device in accordance with the preferred embodiment of the present invention.
Figure 3:
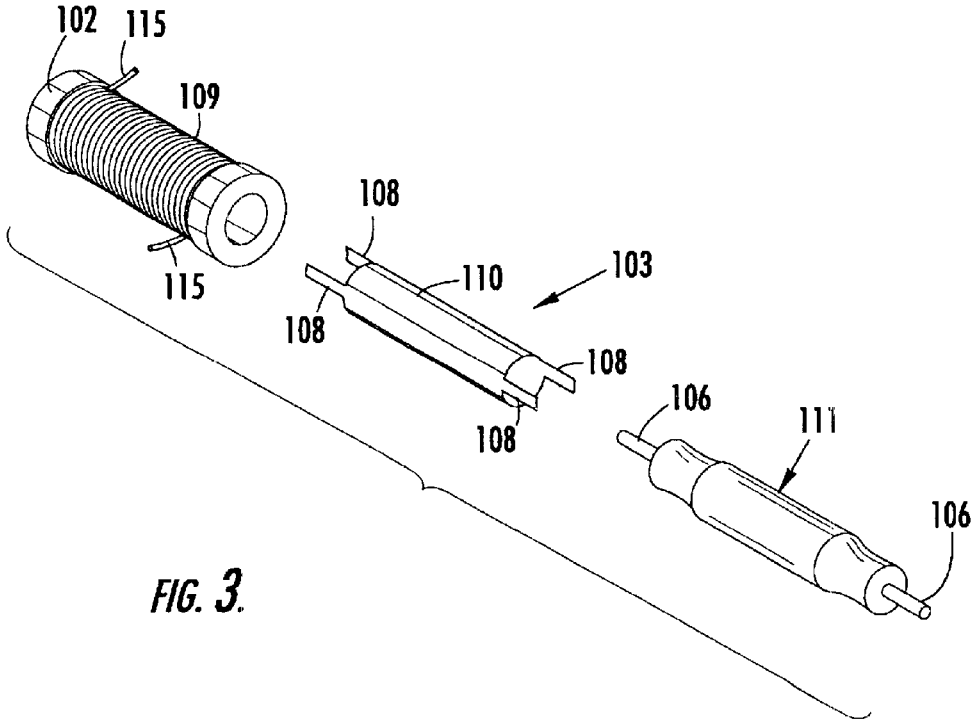
FIG. 3 is an exploded perspective view a reed relay device in accordance with the preferred embodiment of the present invention shown in FIG. 2.
Figure 4:
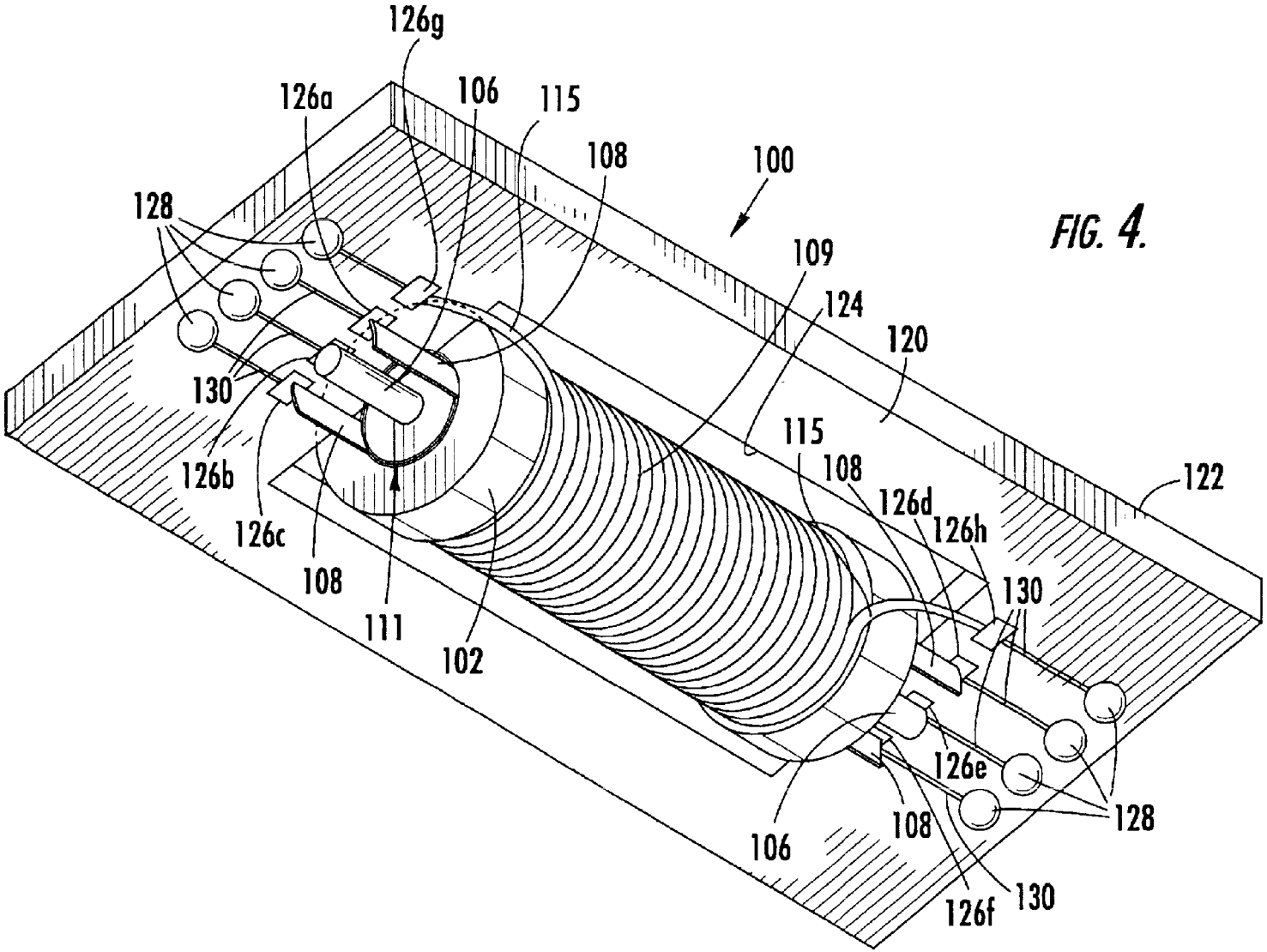
FIG. 4 is a bottom perspective view of the reed relay card in accordance with the present invention.
Figure 5:
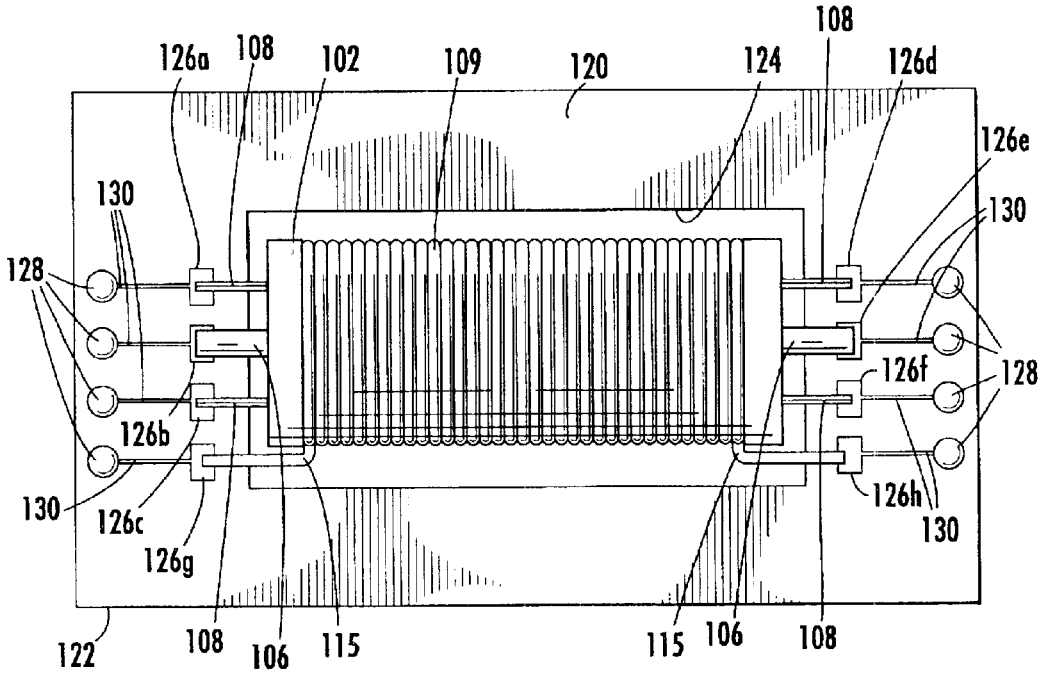
FIG. 5 is a bottom plan view of the reed relay card in accordance with the present invention.
Figure 6:
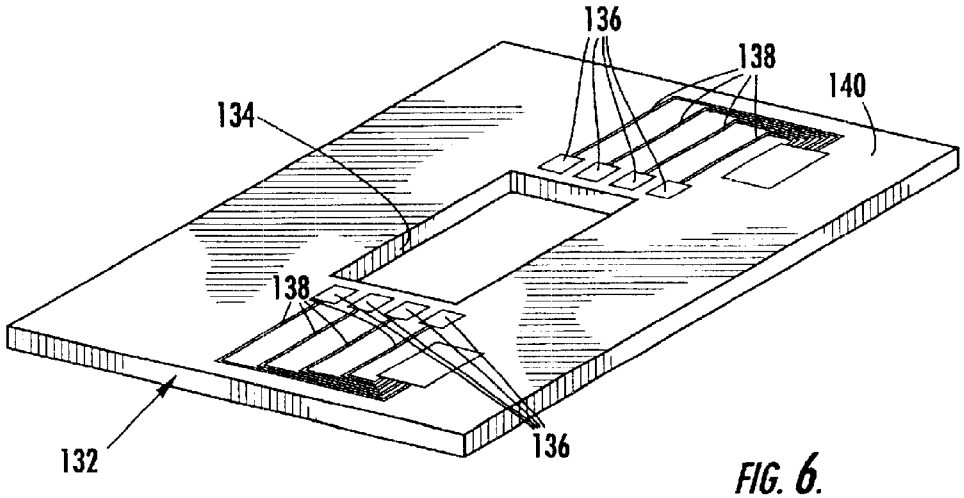
FIG. 6 is a perspective view of a circuit board for receipt of the reed relay card in accordance with the present invention.

Turning now to FIGS. 2–8, the preferred embodiment of the present invention is shown. Referring to FIG. 2, a modified reed device 103 is provided to include an outer bobbin 102 with coil 109 wrapped around it for introducing the necessary magnetic field to actuate the reed switch 111. Ends of wire 109 may be connected to posts, pins, or the like (not shown) connected to bobbin 102 to provide for electrical interconnection of the magnetic field current. Emanating from the reed switch 111 are two signal leads 106 which correspond to opposing sides of the reed switch 111. Also emanating from the bobbin body 102 are a pair of shield or ground tabs 108 on each side of the bobbin body 102 that are electrically interconnected to, as shown in FIG. 6, the ends of the inner shield sleeve 110. As shown in FIG. 3, an exploded perspective view the reed switch 111 of FIG. 2, these ground tabs 108 are extensions from the shield sleeve 110 itself on opposing sides thereof.

In particular, the reed switch 111 includes a signal conductor 106 within a glass capsule with an inert gas or vacuum surrounding it. Positioned about the glass capsule is a ground shield 110 which is preferably of a cylindrical or tubular configuration but may be of an oval cross-section to accommodate certain reed switches 111 or multiple reed switches in a multiple channel environment. The foregoing assembly is housed within the bobbin 102 which includes an energizing coil 109.

Referring to FIG. 4, a perspective view of a reed switch package 100 is shown. This complete reed switch package 100 includes the reed switch 111 shown in FIGS. 2 and 3 affixed to the surface 120 of a relay card 122. In particular, the relay card 122 includes an aperture 124 which is large enough to receive at least a portion of the bobbin or main body 102 of the reed switch 111 therein to reduce the overall height of the package 100. For example, about ⅓ of the volume of the bobbin 102 resides within the upper seat aperture 124 in the relay card 122.

Referring both to FIGS. 4 and 5, the relay card 122 includes a number of contact pads 126a–f for respectively receiving the signal leads 106 and ground leads 108 of the reed switch 111. Preferably, three contact pads 126a, 126b and 126c are provided on the left side of the upper seat aperture 124 to correspond with the single signal lead 106 and two ground leads 108 on the left side of the reed switch 111. The opposing contact pads 126d, 126e and 126f are provided on the right side of the upper seat aperture 124 to correspond with the single signal lead 106 and two ground leads 108 on the right side of the reed switch 111. Pads 126g and 126h are provided for termination of coil leads 115.

Further, interconnection members 128, such as solder balls, are also provided on the same surface 120 of the relay card 122 to electrically interface with the circuit board into which the reed switch package 100 is installed, which will be described in detail below. The electrical interconnection members 128, may also be of other types, such as a land grid array (LGA), column grid array (CGA) or pin grid array (PGA) as well as solder bumps and solder paste dots. The electrical interconnection members 128 are electrically connected to respective ones of the contacts pads 126a–h to provide electrical continuity to the signal leads 106, ground leads 108 and coil leads or ends 115 are terminated in the same fashion, although their physical location may vary widely with respect to the switch and signal topology. Circuit board traces 130 are preferably employed to provide the electrical connection between the contact pads 126a–h and the electrical interconnection members 128. Any other type of electrical interconnection may be employed to replace the circuit board traces 130.

In accordance with the present invention, the signal through the reed switch 111 is optimized because the co-axial configuration of the reed switch 111 is maintained to the interconnection members 128 due to the presence of circuit board traces 130 connected to the ground leads 108 which are on opposing sides of the traces 130 connected to the signal leads 106 to maintain a wave guide across the lower surface 120 of the relay card 122 to ensure a complete controlled impedance environment.

Figure 7:
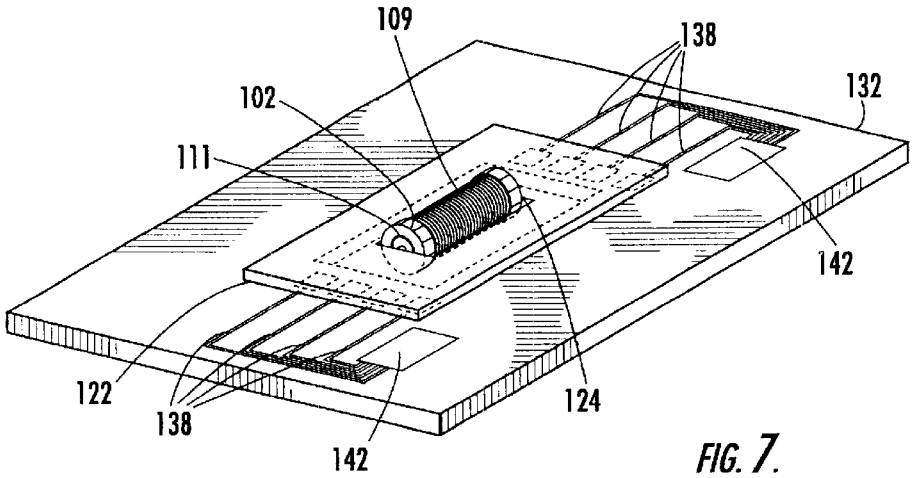
FIG. 7 is a perspective view the reed relay card installed in the circuit board shown in FIG. 6.
Figure 8:
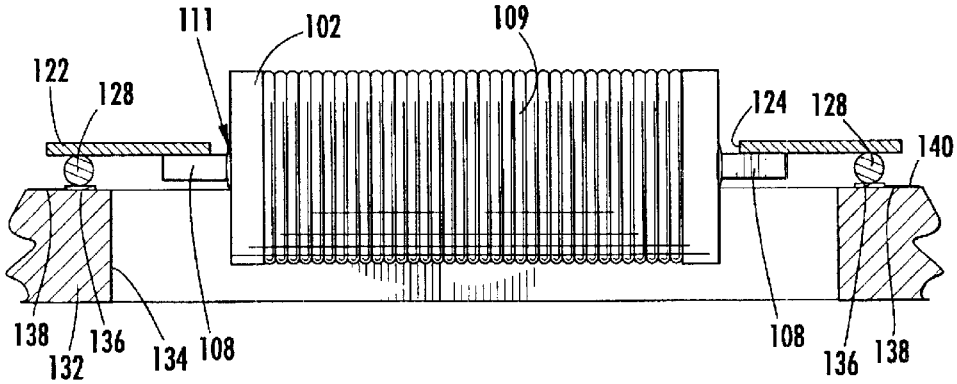
FIG. 8 is a side elevational view of the reed relay card installed in the circuit board shown in FIG. 6.

Referring now to FIGS. 6–8, installation of the reed switch package 100 to a main circuit board 132 is shown. FIG. 6 illustrates a sample circuit board 132 in a accordance with the present invention where in a relief aperture 134 is provided therethrough for seating. A complete through-aperture 134 is provided; however, a recess (not shown) in the component-mounting surface of the main circuit board 132 is also contemplated and within the scope of the present invention. The main circuit board 132 includes an array of contact pads 136 which are complementary to the electrical interconnection members 128 on the bottom surface 120 of the relay card 122. Electrical traces 138 are also provided on the main circuit board 132 to electrically interconnect the reed switch package 100 into the circuit at hand.

As shown in FIGS. 7 and 8, the reed switch package 100, with the reed device 111 mounted on a relay card 122, is installed into the aperture 134 on the component-mounting surface 140 of the main circuit board 132 in an inverted manner, such that approximately ⅓ of the bobbin 102 of the reed device 111 residing within the seating aperture 134 of the main circuit board 132. The electrical interconnection members 128 are mated to corresponding contact pads 136 on the top surface 140 of the circuit board 132 and secured in place to electrically interconnect the reed device 111 into the circuit, representationally referenced by numeral 142 on the circuit board 132. As best seen in FIG. 8, a low profile reed switch package 100 is provided where the bobbin portion 102 of the reed device 111 partially resides through the relay card 122 and partially within the main circuit board 132. As a result, the overall height of the reed switch package 100 is greatly reduced thus allowing for a low height installation of components on the circuit board 132 to permit installation into smaller environments and to facilitate closer stacking of populated multiple circuit boards 132 together.

The present invention provides a wave guide to simulate a true coaxial environment. This unique wave guide extends from the reed device 111 itself to the electrical interconnections 128 at the bottom of the reed switch package 100. Unlike the prior art, the wave guide or simulated co-axial arrangement is continuous from the reed switch 111 itself to the electrical interconnections 124 where a microstrip or wave guide is typically present on the circuit board 132. Such a wave guide on the circuit board 132 is provided by traces 138 connected to the ground leads. As a result, the signal is protected from uncontrolled discontinuities. The shielding protection for the signal lead 106 is extended and controlled from the actual body of the reed switch 111 to the actual electrical interface to the circuit board 132. In accordance with the present invention, the impedance of the signal transmission path is maintained substantially consistent through its entire length within package 100 and is matched to the desired overall impedance value thus obviating the need for substantial circuit tuning by the user.

As can be understood, present invention provides either an actual or simulated co-axial environment for superior protection of the signal lead 106 of the reed switch 111. This continuous co-axial protection without the use of vias through the relay substrate is not found in prior art packages. The integrated wave guide on the reed switch package 100 enable a continuous co-axial environment to be provided from the reed switch directly down to the electrical interconnection to the circuit board 132. In most applications, due to the frequency of the signal transmitted by the reed switch 111, a complete continuous ground loop is not needed to provide a co-axial arrangement for signal lead protection. In the present invention, the ground conductor traces 130, which are connected to ground leads 108, are preferably spaced apart from one another a distance of 1.27 mm or 1.00 mm; however, other distances may be employed. Common frequencies for the reed switch 111 are in the 1.0 to 8.0 GHz range. At these frequencies, the wavelengths are in the 300 mm to 40 mm range. The wavelengths are too long to sense any discontinuities of the "simulated" co-axial arrangement. Therefore, the simulated co-axial arrangement is essentially identical in effectiveness compared to a true full co-axial arrangement. As a result, this topology provides for effective shielding until the wavelength gets so small that the conductor trace spacing will be seen as discontinuous. For the trace spacing as discussed above, effective shielding can be realized with the present invention with wavelengths as low as 8 mm with a frequency of 37 GHz. Greater or fewer conductive traces 130 may be employed depending on the device within the package and the application at hand.

The package 100 of the present may be easily modified to accommodate more than one reed switch 111 at a time to provide multiple channels. In this arrangement, the appropriate electrical contacts 128, e.g. solder ball interconnections, are employed for each reed switch 111 corresponding to a given channel. Further, many different types of interconnections 128 may be employed by the package 100 of the present invention. It should be understood that the package 100 of the present invention can accommodate a wide array of electronic devices that require signal lead shielding with a controlled impedance environment.

The package 100 of the present invention may be employed to carry out many different types of circuit arrangements using reed switches 111 with the added unique capability of superior protection of the signal lead 106 of a reed switch 111 by simulating the co-axial environment in accordance with the present invention.

FIG. 9 illustrates a specific sample application of the package of the present invention. The diagram of FIG. 9 illustrates a circuit 300 that is commonly employed in ATE (Automatic Testing Equipment) for the purpose of testing circuit devices, generally referenced as 313, and the like. This circuit 300 sets forth a three terminal device that may be "stackable" in series, end to end, depending on the application. A three terminal device 306 with a first reed switch 302 and a second reed switch 304 is shown in FIG. 9 as generally referenced by the dotted lines. For example, the first reed switch device 302 provides a connection for a high frequency AC signal while the second reed switch 304 provides a connection for a DC signal or low frequency AC signal.

More specifically, a signal generator 308 is connected to the first terminal 310 of the first reed switch 302. A second reed switch 304 is provided with a first terminal 312 and a second terminal 314. A second terminal 316 of the first reed switch 302 is connected to the second terminal 314 of the second reed switch 304 at node 318. This node 318 becomes the output terminal 326 to the device 306. A second pair of reed switches 320, 322 is employed to receive the stimulus from the device under test, (DUT) 313. Receiver 317 receives the output from the second pair of reed switches 320, 322. The serial nature of the pair of switches enables a circuit to be designed with a number of different test operations to a different number of DUTs which are independently selectable and isolatable. FIG. 10 illustrates a representational schematic of one of the pair of reed relays that carry out the circuit diagram of FIG. 9.

In the prior art, to carry out this circuit, two individual reed switches are connected to a circuit board (not shown) with the appropriate connection 324 comprised of the leads of the switches and the trace on the circuit board therebetween. This results in a long, unprotected and vulnerable connection between the terminals of the reed switches and the circuit board which is commonly termed a "stub connection." As a result of this long, unprotected stub connection 324, significant parasitic capacitance C to ground will be present. This is termed a "stub capacitance" and acts to load the high frequency path, thus limiting the frequency of the circuit to a value in the range of about 5.0 GHz, for example. However, to properly test very fast devices under test (DUT), such as high-speed microprocessors, the frequency of the test circuit must reach the 7 GHz range and higher in the future. Therefore, with a prior art mounting of the reed switches 302, 304 and stub connection 324 on the circuit board, this circuitry 300 is incapable of testing high-speed devices. The protection of a this stub connection is an example of many different ways to employ the present invention.

However, employing the present invention, circuit 300 may easily operate at frequencies in the 7 GHz range and above to accommodate the testing of high-speed devices because the high-frequency path is protected using the simulated co-axial signal protecting environment as discussed in detail above. The stub connection resides inside the device, thus minimizing its length which inherently minimizes the capacitive parasitic load. Moreover, the fact that the stub resides in the device allows the use of other techniques for capacitance control and compensation.

While the package of the present invention is shown to employ solder balls in a BGA package for electric interconnection to a circuit board 132, other types of interconnections 128 may be employed such as pin grids, land grids or column grids. Further, ball grid array socket arrangement may be used to facilitate removal or replacement of the package when desired. The relay card is preferably made of typical circuit board material but may be manufactured of any other material suitable for electronic device packages. The electrical traces 130,138 employed in the present invention may be made of known conductive materials, such as copper, aluminum, tin and other alloys known in the industry.

Since the reed relay package 100 is mounted on a relay card instead of being completely encapsulated into a closed package, the relay card can be made much thinner. A thin relay card results in lower cost because a thin, single layer, non-laminated construction can now be employed. Also, with a thin relay card providing the substrate for the package 100, controlled depth routing can be eliminated and the signal path can be reduced thus providing better maintenance of the desired impedance of the signal path.

The reed switch package, in accordance with the present invention, is preferably fully enclosed in metal or non-metallic shell or may be fully overmolded for additional protection of the device. Alternatively, the reed switch package may be partially enclosed with a metal or non-metallic shell, partially overmolded with plastic or partially encapsulated using other materials to provide an air-tight and/or liquid-tight seal in a low profile configuration.

It would be appreciated by those skilled in the art that various changes and modifications can be made to the illustrated embodiments without departing from the spirit of the present invention. All such modifications and changes are intended to be covered by the appended claims.

What is claimed is:

1. A reed device package, comprising:

a reed switch having a main body with first and second electrical signal terminals emanating from opposing sides thereof;

a ground shield surrounding said main body of said reed switch;

a first ground terminal connected to said ground shield;

a second ground terminal connected to said ground shield; said first electrical signal terminal being positioned between said first ground terminal and said second ground terminal;

a support substrate with a top surface and a bottom surface; said support substrate defining an seat aperture therethrough;

said reed switch device being affixed to said bottom surface of said support substrate with said main body of said reed switch residing at least partially within said seat aperture;

a first electrical interconnection member on said bottom surface of said support substrate; said first electrical interconnection member being electrically connected to said first ground terminal;

a second electrical interconnection member on said bottom surface of said support substrate; said second electrical interconnection member being electrically connected to said second ground terminal; and a signal electrical interconnection member on said bottom surface of said support substrate; said signal electrical interconnection member being electrically connected to said first signal terminal.

2. The reed device package of claim 1, wherein said first electrical interconnection member, said second electrical interconnection member and said signal electrical interconnection member are solder balls.

3. The reed device package of claim 1, wherein said first electrical interconnection member is electrically connected to said first ground terminal by a circuit board trace.

4. The reed device package of claim 1, wherein said second electrical interconnection member is electrically connected to said second ground terminal by a circuit board trace.

5. The reed device package of claim 1, wherein said signal electrical interconnection member is electrically connected to said signal terminal by a circuit board trace.

6. A reed device package, comprising:

a reed switch having a main body with a first electrical signal terminal and a second electrical signal terminal emanating from opposing sides thereof;

a ground shield, having a first end and a second end, surrounding said main body of said reed switch;

a first pair of ground terminals connected to said first end of said ground shield; said first electrical signal terminal positioned between said first pair of ground terminals;

a second pair of ground terminals connected to said second end of said ground shield; said second electrical signal terminal positioned between said second pair of ground terminals;

a support substrate with a top surface and a bottom surface; said support substrate defining an seat aperture therethrough;

said reed switch device being affixed to said bottom surface of said support substrate with said main body of said reed switch residing at least partially within said seat aperture;

a first pair of ground electrical interconnection members on said bottom surface of said support substrate; said first pair of said ground electrical interconnection members being electrically connected to said first pair of ground terminals;

a second pair of ground electrical interconnection members on said bottom surface of said support substrate; said second pair of said ground electrical interconnection members being electrically connected to said second pair of ground terminals;

a first signal electrical interconnection member on said bottom surface of said support substrate; said first signal electrical interconnection member being electrically connected to said first electrical signal terminal; and a second signal electrical interconnection member on said bottom surface of said support substrate; said second signal electrical interconnection member being electrically connected to said second electrical signal terminal.

7. The reed device package of claim 6, wherein said first signal electrical interconnection member is positioned between said first pair of ground electrical interconnection members and said second signal electrical interconnection member is positioned between said second pair of ground electrical interconnection members.

8. The reed device package of claim 6, wherein said first pair of ground electrical interconnection members, said second pair of ground electrical interconnection members, said first signal electrical interconnection member and said second signal electrical interconnection member are solder balls.

9. A reed device package, comprising:

a reed switch having a main body with first and second electrical signal terminals emanating from opposing sides thereof;

a ground shield surrounding said main body of said reed switch;

a first ground terminal connected to said ground shield;

a second ground terminal connected to said ground shield; said first electrical signal terminal being positioned between said first ground terminal and said second ground terminal;

a support substrate with a top surface and a bottom surface; said support substrate defining an upper seat aperture therethrough;

said reed switch device being affixed to said bottom surface of said support substrate with said main body of said reed switch residing at least partially within said upper seat aperture;

a first electrical interconnection member on said bottom surface of said support substrate; said first electrical interconnection member being electrically connected to said first ground terminal;

a second electrical interconnection member on said bottom surface of said support substrate; said second electrical interconnection member being electrically connected to said second ground terminal;

a signal electrical interconnection member on said bottom surface of said support substrate; said signal electrical interconnection member being electrically connected to said first signal terminal;

a circuit board having an upper surface and a lower surface; said circuit board defining a lower seat aperture therethrough;

a first circuit board contact on said circuit board and electrically connected to said first electrical interconnection member;

a second circuit board contact on said circuit board and electrically connected to said second electrical interconnection member; and a third circuit board contact on said circuit board and electrically connected to said signal electrical interconnection member.

*10. A reed device package, comprising:*

*a reed switch having a main body with first and second electrical signal terminals emanating from opposing sides thereof;*

*a ground shield surrounding the main body of the reed switch;*

*a first ground terminal connected to the ground shield;*

*a second ground terminal connected to said ground shield; the first electrical signal terminal being positioned between the first ground terminal and the second ground terminal;*

*a support substrate with a first surface and a second surface; the support substrate defining a substrate seat;*

*the reed switch device being affixed to the second surface of the support substrate with the main body of said reed switch residing on the substrate seat;*

*a first electrical interconnection member on the second surface of the support substrate; the first electrical interconnection member being electrically connected to the first ground terminal;*

*a second terminal interconnection member on the second surface of the support substrate; the second electrical interconnection member being electrically connected to the second ground terminal;*

*a signal electrical interconnection member on the second surface of the support substrate; the signal electrical interconnection member being electrically connected to the first signal terminal;*

*a circuit board;*

*a first circuit board contact on the circuit board and electrically connected to the first electrical interconnection member;*

*a second circuit board contact on the circuit board and electrically connected to the second electrical interconnection member; and*

*a third circuit board contact on the circuit board and electrically connected to the signal electrical interconnection member.*

* * * * *